US012267981B2

(12) United States Patent
Gerhart et al.

(10) Patent No.: US 12,267,981 B2
(45) Date of Patent: Apr. 1, 2025

(54) SYSTEM AND METHOD FOR PROACTIVE MANAGEMENT OF HEATING SYSTEMS IN DATA PROCESSING SYSTEMS

(71) Applicant: Dell Products L.P., Round Rock, TX (US)

(72) Inventors: Donald W. Gerhart, Leander, TX (US); Randy Alton Frazier, New Braunfels, TX (US); Curtis Ray Genz, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 437 days.

(21) Appl. No.: 18/047,821

(22) Filed: Oct. 19, 2022

(65) Prior Publication Data

US 2024/0138096 A1 Apr. 25, 2024
US 2024/0237265 A9 Jul. 11, 2024

(51) Int. Cl.
*H05K 7/20* (2006.01)
*G06F 11/30* (2006.01)

(52) U.S. Cl.
CPC ........... *H05K 7/20* (2013.01); *G06F 11/3058* (2013.01)

(58) Field of Classification Search
CPC .............................. H05K 7/20; G06F 11/3058
See application file for complete search history.

(56) References Cited

U.S. PATENT DOCUMENTS

| | | | |
|---|---|---|---|
| 7,698,095 B2 | 4/2010 | Chung et al. | |
| 8,550,702 B2 | 10/2013 | Campbell et al. | |
| 9,581,985 B2 | 2/2017 | Walser et al. | |
| 9,772,664 B1 | 9/2017 | Chou et al. | |
| 9,785,208 B2 | 10/2017 | Lovicott et al. | |
| 9,820,411 B2 | 11/2017 | Alshinnawi et al. | |
| 9,842,003 B2 | 12/2017 | Rao et al. | |
| 9,968,011 B2 | 5/2018 | Shabbir et al. | |
| 10,156,987 B1 | 12/2018 | Gutierrez et al. | |
| 10,191,523 B2 | 1/2019 | Shows et al. | |
| 10,394,294 B2 | 8/2019 | Pfeifer et al. | |
| 10,712,033 B2 | 7/2020 | Atchison et al. | |
| 10,760,809 B2 | 9/2020 | Gillette et al. | |
| 11,009,249 B2 | 5/2021 | Goel et al. | |
| 2002/0158652 A1* | 10/2002 | Okayasu | G01R 31/31922 324/750.03 |
| 2007/0040862 A1* | 2/2007 | Bergstedt | B41J 2/0451 347/19 |
| 2013/0015548 A1 | 1/2013 | Chen et al. | |
| 2014/0027435 A1 | 1/2014 | Chou | |
| 2017/0326282 A1* | 11/2017 | Wilt | A61M 1/362265 |
| 2020/0329533 A1* | 10/2020 | Wallinger | H05B 3/0019 |

\* cited by examiner

*Primary Examiner* — Chad G Erdman
(74) *Attorney, Agent, or Firm* — WOMBLE BOND DICKINSON (US) LLP

(57) ABSTRACT

Methods and systems for managing the operation of data processing systems are disclosed. A data processing system may include a computing device that may provide computer implemented services. To provide the computer implemented services, hardware components of the data processing system may need to operate in predetermined manners. To manage the operation of the hardware components, the data processing system may heat them when their temperatures fall outside of thermal operating ranges. To mitigate some risk associated with heating, the data processing system may proactively validate the operation of hardware and/or software used to manage the components that provide the heat.

20 Claims, 6 Drawing Sheets

SYSTEM AND METHOD FOR PROACTIVE MANAGEMENT OF HEATING SYSTEMS IN DATA PROCESSING SYSTEMS

FIELD OF THE EMBODIMENTS

Embodiments disclosed herein relate generally to device management. More particularly, embodiments disclosed herein relate to systems and methods to proactively validate hardware and/or software to mitigate risk.

BACKGROUND

Computing devices may store data and used stored data. For example, computing devices may utilize data when providing computer implemented services. If computing devices are unable to access data, process data, and/or perform other functions, then the computing devices may be unable to provide some, or all, of the computer implemented services desired by users of the computing devices.

BRIEF DESCRIPTION OF THE DRAWINGS

Embodiments are illustrated by way of example and not limitation in the figures of the accompanying drawings in which like references indicate similar elements.

DETAILED DESCRIPTION

Figure 1:
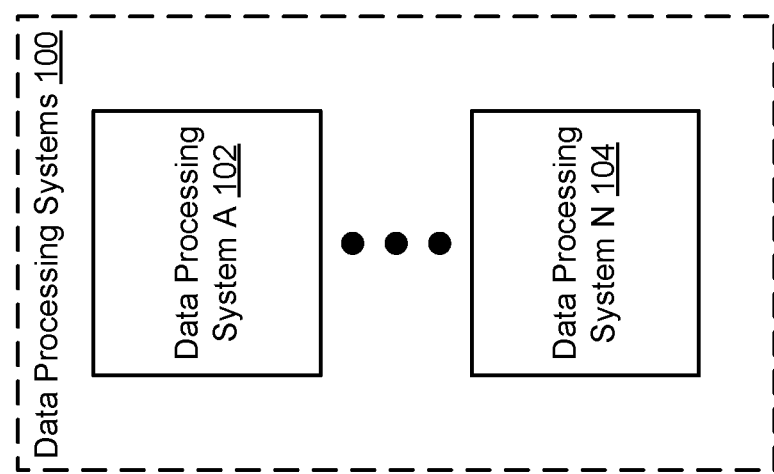
FIG. 1 shows a block diagram illustrating a system in accordance with an embodiment.

Various embodiments will be described with reference to details discussed below, and the accompanying drawings will illustrate the various embodiments. The following description and drawings are illustrative and are not to be construed as limiting. Numerous specific details are described to provide a thorough understanding of various embodiments. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment. The appearances of the phrases "in one embodiment" and "an embodiment" in various places in the specification do not necessarily all refer to the same embodiment.

References in the specification to "adapted to" may, in the context of a programmable device, indicate that the programmable device has been programmed to perform the functionality described with respect to the programmable devices. In the context of a static device, "adapted to" may indicate that the device include circuitry to perform the functionality described with respect to the static devices.

In general, embodiments disclosed herein relate to methods and systems for managing the operation of data processing system. The data processing system may provide computer implemented services.

To provide the computer implemented services the data processing system may include various hardware components. The hardware components may have thermal operating limits that must be met for the hardware components to operate.

To maintain the hardware components within the thermal operating limits, the data processing system may include a thermal management subsystem. The thermal management subsystem may include a heater that may generate heat to warm the hardware components when they are below their thermal operating limits.

To manage the operation of the heater, the thermal management subsystem may include various hardware components which may host various pieces of software (e.g., firmware). Failure of these components (hardware and/or software) may give rise to runaway or uncontrolled operation of the heater. Such operation may present risk to the continued operation of the data processing system.

To mitigate the presented risk, the data processing system may previous a combination of startup and runtime checks of these hardware components and/or firmware. If the checks (e.g., one or more multiple) fail, then the heater may be disallowed from operating thereby mitigating the risk presented by its operation.

By doing so, embodiments disclosed herein may provide a data processing system capable of operating under a wider array of environment conditions while also limiting risk presented by active heating within data processing system. Thus, embodiments disclosed herein may address the technical problem of operating condition limitations of data processing systems. The disclosed embodiments may address this problem by provided a data processing system with active heating capabilities (e.g., usable to warm components that may otherwise be inoperable thereby robbing the data processing systems of some of their capabilities) that also proactively mitigates risk associated with active heating through a specifically ordered set of steps for checking both hardware component and firmware functionality.

In an embodiment, a data processing system that provides computer implemented services is provided. The data processing system may include a heater positioned to, while powered, selectively warm a temperature sensitive hardware component; a temperature sensor positioned to monitor a temperature associated with heating by the heater; a heater power system adapted to: selectively power the heater based on an adjustable temperature threshold; and a thermal manager adapted to: identify a startup of the data processing system; based on the identified startup: perform a cutoff test of the heater power system to identify a power cutoff capability state of the heater power system; make, based on the power cutoff capability, a first determination regarding whether the heater power system passed the cutoff test; and in a first instance of the first determination where the heater power system passed the cutoff test: perform a run mode test of the heater power system to identify a run mode capability state of the heater power system.

The thermal manager may be further adapted to make, based on the run mode capability state, a second determination regarding whether the heater power system passed the run mode test; in a first instance of the second determination where the heater power system passed the run mode test: allow operation of the heater; in a second instance of the second determination where the heater power system did not pass the run mode test: disallow the operation of the heater.

The thermal manager may be further adapted to in a second instance of the first determination where the heater power system did not pass the cutoff test: disallow the operation of the heater.

Allowing the operation of the heater may include setting the adjustable temperature threshold for the operation of the heater to a runtime temperature to obtain an updated adjustable temperature limit.

Selectively powering the heater may include comparing the temperature monitored by the temperature sensor to the updated adjustable temperature limit; and depowering the heater when the temperature exceeds the updated adjustable temperature limit.

Performing the cutoff test of the heater power system may include identifying an ambient temperature; setting a cutoff temperature of the heater power system to a temperature below the ambient temperature; monitoring, while the cutoff temperature is set to the temperature below the ambient temperature, an operating state of the heater to identify the power cutoff capability, the power cutoff capability being positive when the operating state of the heater is inoperable while the cutoff temperature is set to the temperature below the ambient temperature and the power cutoff capability being negative when the operating state of the heater is operable while the cutoff temperature is set to the temperature below.

The thermal manager may also be adapted to, based on the identified startup: initiate operation of a timer; while the timer is operating: monitor for a heartbeat signal from at least one firmware enabled component tasked with managing, in part, operation of the heater; make, based on the monitoring for the heartbeat signal, a second determination regarding whether the heartbeat signal is obtained prior to expiration of the timer; in a first instance of the second determination where the heartbeat signal is not obtained prior to the expiration of the timer: disallow operation of the heater; in a second instance of the second determination where the heartbeat signal is obtained prior to the expiration of the timer: allow operation of the heater, and restart the time. The heartbeat signal may be signal produced by various components to indicate to other components that the various components are operating as expected. The heartbeat signal may take any form.

The heater may be depowered until selectively powered by the heater power system after the startup begins.

The temperature sensitive hardware component may include a management controller that manages operation of the data processing system.

The heater may include a resistive heating element.

In an embodiment, a computer-implemented method is provided. The computer-implemented may provide the functionality of the data processing system and/or components thereof, discussed above.

In an embodiment, a non-transitory media is provided. The non-transitory media may include instructions that when executed by a processor cause the computer-implemented method to be performed.

Turning to FIG. 1, a block diagram illustrating a system in accordance with an embodiment is shown. The system shown in FIG. 1 may provide any quantity and type of computer implemented services. To provide the computer implemented services, the system of FIG. 1 may include data processing systems 100.

All, or a portion, of data processing systems 102-104 may provide computer implemented services to users and/or other computing devices operably connected to data processing systems 100. The computer implemented services may include any type and quantity of services including, for example, database services, instant messaging services, video conferencing services, etc. Data processing systems 100 may provide other types of computer implemented services without departing from embodiments disclosed herein. Data processing systems 100 may each provide similar and/or different computer implemented services, and any of data processing systems 100 may provide any of the computer implemented services in cooperation with other data processing systems and/or independently.

To provide computer implemented services, data processing systems 100 may need to operate in a predetermined manner. The predetermined manner of operation may include, for example, executing an operating system, drivers, and/or other type of management entities that mediate, facilitate, or otherwise operate in a manner which enables the applications to operate (e.g., by providing abstracted access to hardware resources used in the execution of the applications).

To operate in the predetermined manner, data processing systems 100 may perform one or more operations to enter the predetermined manner of operation (by changing from other manners of operation to the predetermined manner of operation). These operations may include, for example, a boot process from a power-on (or reset or other manner of operation that differs from the predetermined manner of operation to the extent that the applications may not be able to operate) to hand off operation management of the data processing system to an operating system or other type of operational management entity that places data processing systems 100 into the predetermined manner of operation. The operating system may, for example, provide abstracted access to resources (e.g., processing resources provided by processors, memory resource provided by memory modules, storage resources provided by storage devices, etc.) utilized by the applications hosted by the data processing system.

For example, consider a scenario where a data processing system has been shut off. After the data processing system is turned on, the data processing system may be operating in a startup manner such that the data processing system is not yet able to support execution of an application (e.g., the application may not be able to successfully execute until the data processing system hosts an operating system or other type of management entity). To enter the predetermine manner of operation conducive to execution of the application, the data processing system may go through a boot process (e.g., a startup) which may be performed by one or more types of management entity such as a basic input-output system and/or other startup management entities. The management entity may perform any number of actions (e.g., a "startup process") to prepare the data processing system to begin execution of an operating system and/or other type of management entity that facilitates execution of applications.

To perform the startup process and provide the computer implemented services, data processing systems 100 may include various hardware components (e.g., integrated circuit-based devices). The hardware components may perform various types of functionalities including, for example, (i) data processing functionality through which the computer implemented services may be provided, (ii) system management functionality through which the operation of the respective data processing systems may be managed, and/or (iii) other types of functionalities.

The system management functionality may include, for example, (i) monitoring of temperatures of various hardware components (e.g., any of which may be a temperature sensitive hardware component which may not operate under certain thermal conditions), (ii) modifying the temperatures of the hardware components via heating and/or cooling, and/or (iii) performing other actions to place the hardware components into condition provide their respective functionalities.

In general, embodiments disclosed herein relate to systems, devices, and methods for improving the likelihood that data processing systems 100 are able to provide their computer implemented services. To improve the likelihood that data processing systems 100 are able to provide their computer implemented services, data processing systems 100 implement a framework for proactively validating that various hardware components, subsystems, and/or other portions of data processing system 100 at varying levels of granularity (i) are able to provide their functionalities, (ii) are likely to continue to provide their functionalities, and/or (iii) do continue to provide their respective functionalities. By doing so, data processing systems 100 may be more likely to be capable of providing the computer implemented services by proactively identifying and/or remediating issues impacting data processing system 100.

To implement the framework, data processing systems 100 may implement processes to verify the operation of both hardware and software components of the hardware components that constitute various portions of the data processing system. The verification process may include (i) during startup, a nested set of both firmware and hardware checks on the hardware components and (ii) continuous monitoring and checking of the operation of the firmware and hardware components during operation of the data processing system. By doing so, various portions of data processing systems 100 may be more likely to perform their respective functionalities.

For example, consider a scenario where a subsystem of a data processing system is tasked with thermally managing the hardware components of the data processing system. To thermally manage the hardware components, the subsystem may include, for example, heating devices (e.g., resistive heating elements) and/or cooling devices (e.g., fans). The subsystem may also include a management component (e.g., a programmable device) tasked with managing the heating devices. However, should the management component's software fail (e.g., lock up, error in operation, etc.) or other hardware components that assist in controlling the operation of the heating devices fail, then the heating devices may operate uncontrollably resulting in undesired impacts (e.g., minor and/or catastrophic) on the data processing system.

By doing so, embodiments disclosed herein may provide a data processing system that is more likely to be able to provide desired computer implemented service by proactively identifying and/or mitigating the impact of management component failures (e.g., hardware or software based failures).

Figure 2:
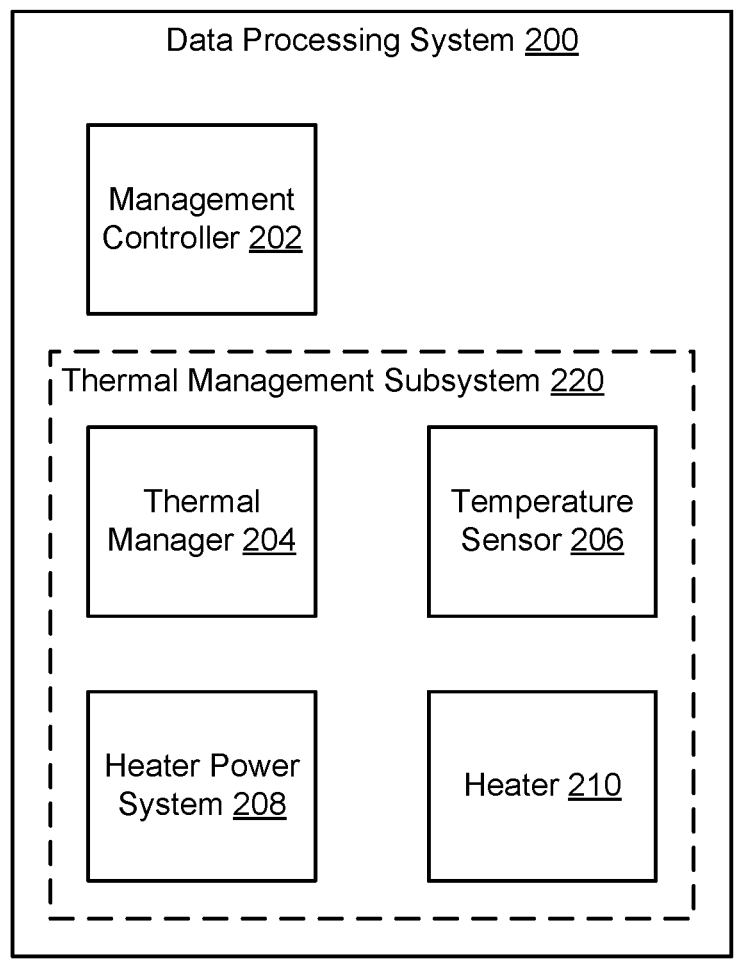
FIG. 2 shows a block diagram illustrating a data processing system in accordance with an embodiment.
Figure 3A:
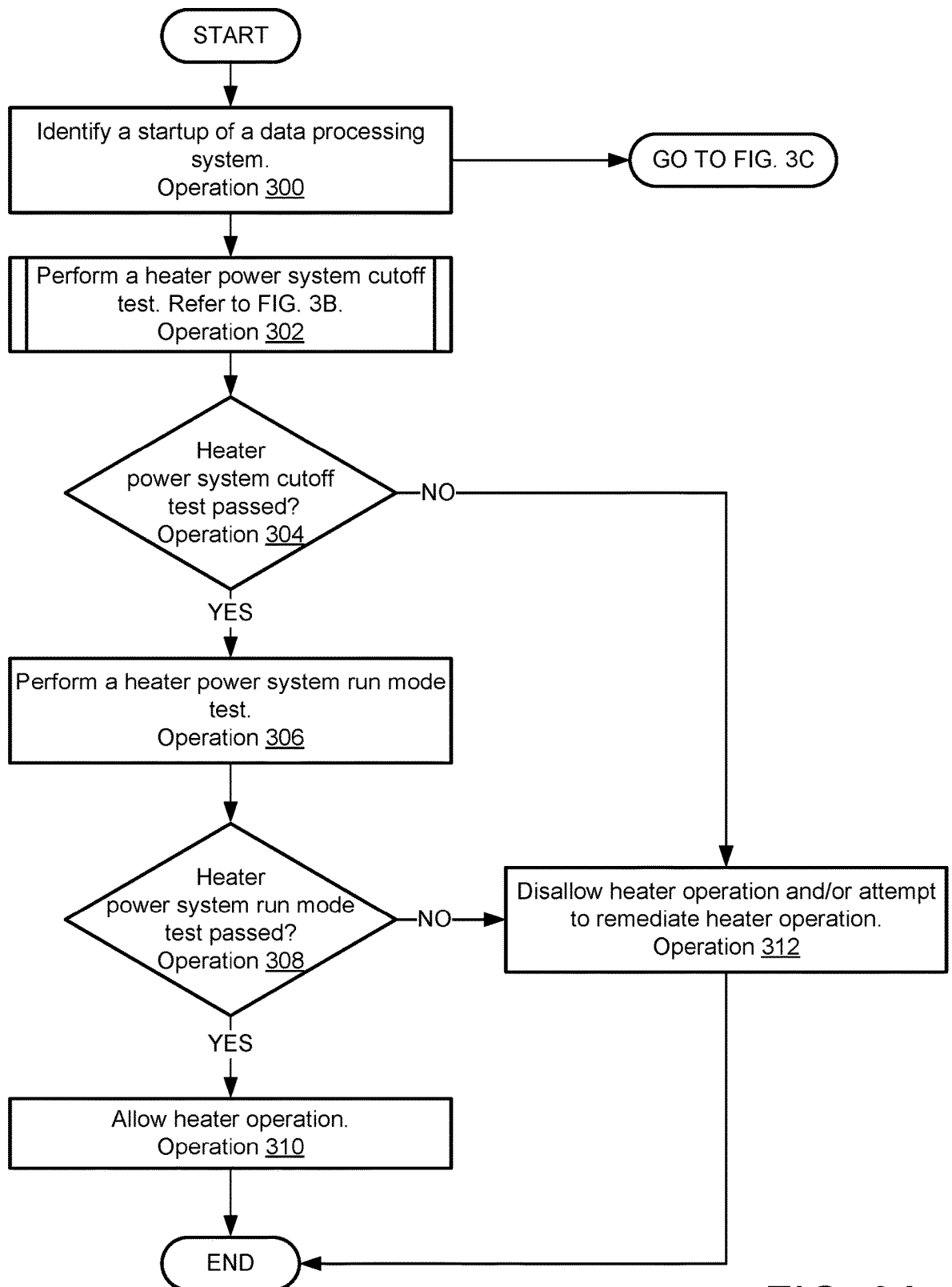
FIG. 3A shows a flow diagram illustrating a method of managing operation of a data processing system in accordance with an embodiment.
Figure 3B:
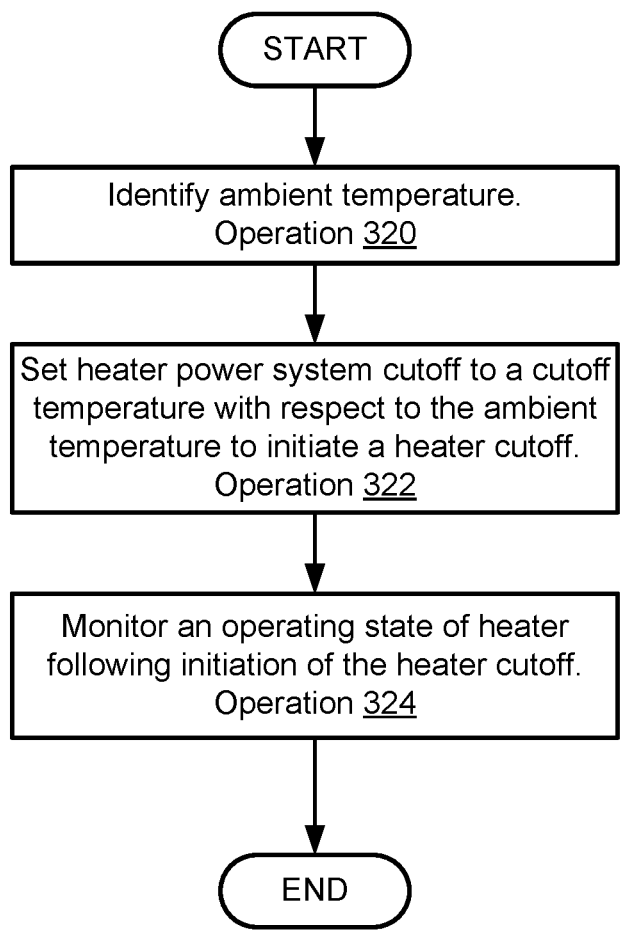
FIG. 3B shows a flow diagram illustrating a method of performing a heater power system run mode test in accordance with an embodiment.
Figure 3C:
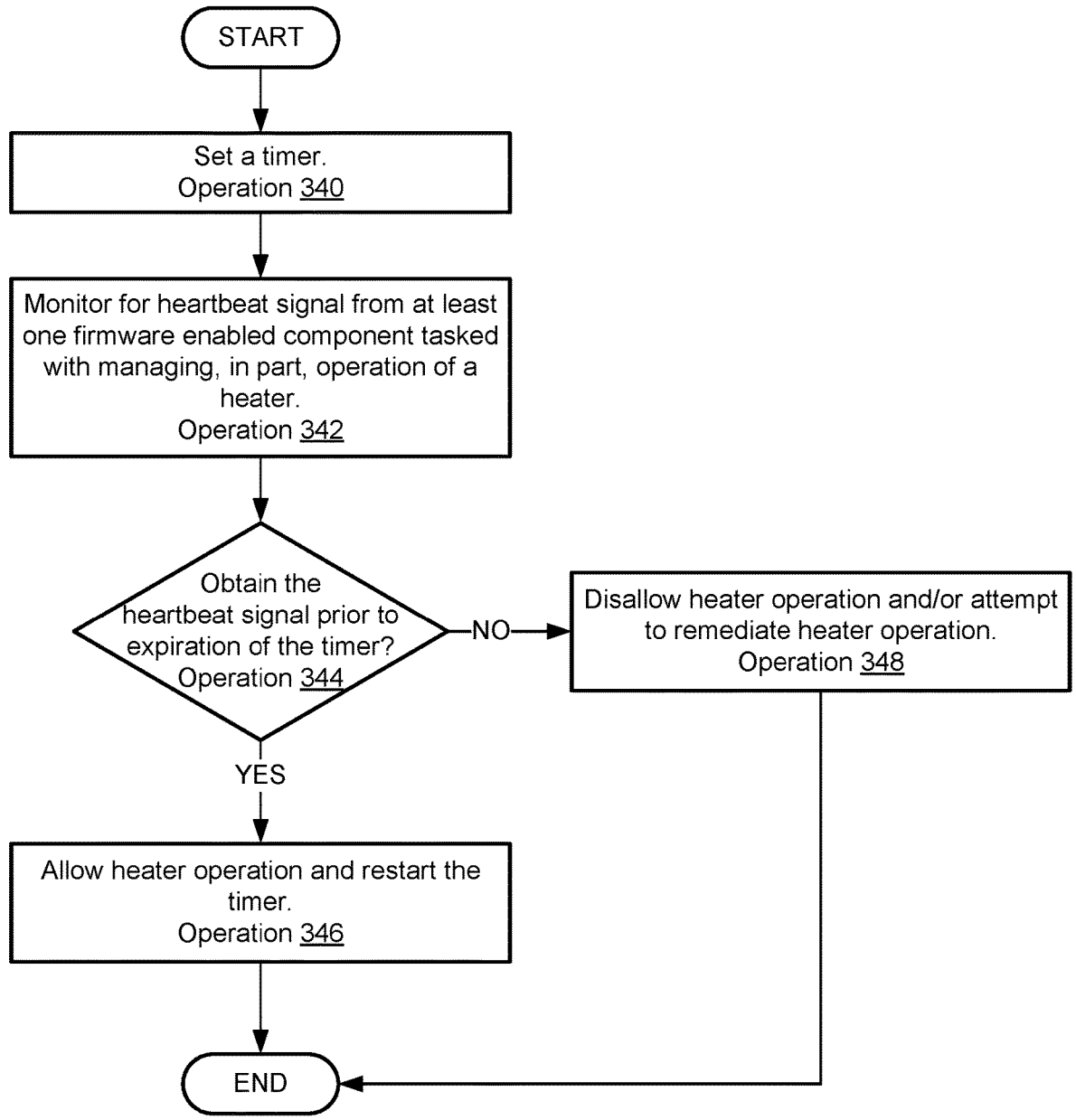
FIG. 3C shows a continuation of the flow diagram illustrated in FIG. 3A.

When providing their functionalities, any of data processing systems 100 may perform all, or a portion, of the methods illustrated in FIGS. 3A-3C. Refer to FIG. 2 for additional details regarding data processing systems.

Any of data processing systems 100 may be implemented using a computing device such as a host or server, a personal computer (e.g., desktops, laptops, and tablets), a "thin" client, a personal digital assistant (PDA), a Web enabled appliance, a mobile phone (e.g., Smartphone), and/or any other type of computing device or system. For additional details regarding computing devices, refer to FIG. 4.

The system of FIG. 1 may include any number and types of data processing systems 100. Any of the aforementioned devices may operate independently and/or cooperatively to provide computer implemented services. Data processing systems 100 may provide such services to, for example, user of the data processing systems 100, to other data processing systems 100, and/or to other devices not shown in FIG. 1.

Data processing systems 100 may be operably connected to any of each other and/or other devices via a communication system (not shown). The communication system may include one or more networks that facilitate communication between data processing systems 100 (or portions thereof) and/or other devices. The networks may include, for example, wired networks, wireless network, public networks, private network, the Internet, etc.

While illustrated in FIG. 1 as included a limited number of specific components, a system in accordance with an embodiment may include fewer, additional, and/or different components than those illustrated therein.

Turning to FIG. 2, a diagram of an example data processing system 200 in accordance with an embodiment is shown. Data processing system 200 may be similar to any of data processing systems 100.

Data processing system 200 may provide any number and type of computer implemented services. To provide the computer implemented services, data processing system 200 may include various hardware components (e.g., processors, memory modules, storage devices, etc., not shown in FIG. 2).

To manage its own operation, data processing system 200 may include management components (e.g., hardware components) such as management controller 202 and various subsystems such as thermal management subsystem 220. Each of these components is discussed below.

Management controller 202 may manage the operation of data processing system 200. To do so, management controller 202 may monitor the operation of data processing system 200 and take action to remediate undesired operation. As part of its functionality, management controller 202 may manage the operation of thermal management subsystem 220. To manage thermal management subsystem 220, management controller 202 may periodically validate the operation of firmware and/or hardware components of thermal management subsystem 220. Operation of various portions of thermal management subsystem 220 may be suspended if the firmware and/or hardware components cannot be validated.

When providing its functionality, management controller 202 may perform all or a portion of the methods shown in FIGS. 3A-3C.

Generally, management controller 202 may be implemented using an in-band or out-of-band management controller.

Thermal management subsystem 220 may manage the thermal state of various hardware components of data processing system 200. To manage the thermal state of the various hardware components, thermal management subsystem 220 may (i) monitor the temperatures of the hardware components, and (ii) warm or cool the hardware components to maintain their temperatures within desired ranges (e.g., operational ranges). To provide its functionality, thermal management subsystem 220 may include thermal manager 204, temperature sensor 206, heater power system 208, and heater 210. Each of these components is discussed below.

Thermal manager 204 may manage the operation of the other components of thermal management subsystem 220. To do so, thermal manager 204 (i) validate that the components are operating properly prior to their operation for thermal management purposes, (ii) while operating, continue to monitor and validate their operation, and/or (iii) when their operation cannot be validated, disable their operation. By doing so, thermal manager 204 may reduce the likelihood of undesired events from occurring such as, for example, runaway heating by heater 210.

When providing its functionality, thermal manager 204 may perform all or a portion of the methods shown in FIGS. 3A-3C.

In an embodiment, thermal manager 204 is implemented using a hardware device including circuitry. The hardware device may be, for example, a digital signal processor, a field programmable gate array, or an application specific integrated circuit. The circuitry may be adapted to cause the hardware device to perform the functionality of thermal manager 204. Thermal manager 204 may be implemented using other types of hardware devices without departing embodiment disclosed herein.

In an embodiment, thermal manager 204 is implemented using a processor adapted to execute computing code stored on a persistent storage that when executed by the processor performs the functionality of thermal manager 204 discussed throughout this application. The processor may be a hardware processor including circuitry such as, for example, a central processing unit, a processing core, or a microcontroller. The processor may be other types of hardware devices for processing information without departing embodiment disclosed herein.

Temperature sensor 206 may monitor (e.g., directly, or indirectly) the temperature of gas flows and/or components heated by heater 210 and provide information regarding the temperature to other components such as management controller 202, heater power system 208, and/or other components or devices. Temperature sensor 206 may be implemented with, for example, a thermocouple or other temperature measurement component.

Heater power system 208 may selectively provide power to heater 210 thereby causing it to selectively generate heat. Heater power system 208 may also include functionality to cutoff power to heater 210. For example, thermal limits may be set and monitored via temperature sensor 206. If the operation of heater 210 causes the thermal limits to be exceeded, then power to heater 210 may be cut off.

Similarly, heater power system 208 may include functionality to cutoff power to heater 210 if the operation of various components (e.g., thermal manager 204) cannot be validated. Consequently, if management controller 202 or thermal manager 204 is unable to validate that the firmware and/or hardware component functionality used to control heater 210 cannot be validated, then either of these management components may use the functionality of heater power system 208 to depower heater 210 (e.g., until the firmware and/or hardware operation are restored).

Heater power system 208 may be implemented using a power supply and one or more semiconductor devices (e.g., field effect transistors used to restrict current flow to heater 210) to selectively power heater 210. For example, the semiconductor devices may be used to modulate the quantity of power supplied to heater 210.

Heater 210 may selectively heat various components of data processing system 200. Heater 210 may be implemented with, for example, a resistive heater and/or a power supply. The power supply and/or resistive heater may be controller by management controller 202, thermal manager 204, and/or other components.

While only temperature sensor 206 and heater 210 are shown in FIG. 2, data processing system 200 may include any number of heaters and temperature sensors without departing from embodiments disclosed herein.

While illustrated in FIG. 2 with a limited number of specific components, a data processing system may include additional, fewer, and/or different components without departing from embodiments disclosed herein.

As discussed above, the components of FIG. 1 may perform various methods to increase the likelihood of data processing systems being able to provide computer implemented services. FIGS. 3A-3C illustrate examples of methods that may be performed by the components of FIG. 1. In the diagrams discussed below and shown in these figures, any of the operations may be repeated, performed in different orders, omitted, and/or performed in parallel with or a partially overlapping in time manner with other operations.

Turning to FIG. 3A, a flow diagram illustrating a method of managing the operation of a heater of a data processing system in accordance with an embodiment is shown. The method may be performed, for example, by a data processing system, a thermal manager, a management controller, and/or other components illustrated in FIGS. 1-2.

At operation 300, a startup of the data processing system is identified. The startup may be identified, for example, monitoring for the data processing system being powered on, restarted, or otherwise initiating performance of the startup.

Based on the startup, one or more processes may be initiated. A first of the processes may perform an initial check of firmware and/or hardware components that contribute to operational management of a heater. A second of the processes may provide for continuous monitoring of the firmware and/or hardware components that contribute to operational management of the heater.

Following operation 300, operation 302 and/or operation 340 shown in FIG. 3C may be performed.

At operation 302, a heater power system cutoff test may be performed. The heater power system cutoff test may be performed by putting in place conditions that would otherwise result in power being cutoff to the heater. The test may ascertain whether power was cutoff under those conditions. Performance of the cutoff test may determine whether some hardware components used to manage the operation of the heater are in good condition (e.g., operating as expected).

In an embodiment, the heater power system cutoff test is performed via the method illustrated in FIG. 3B. The heater power system cutoff test may be performed via other methods without departing from embodiments disclosed herein.

At operation 304, a determination is made regarding whether the heater power system cutoff test was passed. The heater power system cutoff test may be passed if the power was cut to the heater when exposed to the conditions during the heater power system cutoff test.

If the heater power system cutoff test is passed, then the method may proceed to operation 306. Otherwise, the method may proceed to operation 312 following operation 304.

At operation 306, a heater power system run mode test is performed. The heater power system run mode test may be performed by (i) setting thresholds (e.g., temperature thresholds used to trigger and/or restrict operation of the heater) to those that will be used during operation of a data processing system, (ii) monitoring the operation of the heater power system and heater with these thresholds in place, and (iii) comparing the operation to that expected.

For example, the thresholds may be set by configuring the heater power system to provide or deny power to the heater depending on a temperature measured by a temperature sensor (e.g., temperatures of gasses heated by the heater, of components heated by the gasses, etc.). These thresholds may be used, for example, to drive comparators or other semiconductor devices. The comparators or other devices may also receive temperature measurements and compare them to the thresholds. The output of the comparator may be used, for example, to drive a field effect transistor or other semiconductor device used to deny and/or drive power to the heater. If the heater then operates as expected (e.g., generates or does not generate heat) based on the comparison between the threshold and temperature measurement, then it may be determined that the hardware components used to manage the operation of the heater are in good condition.

At operation 308, a determination is made regarding whether the heater power system run mode test was passed. The heater power system run mode test may be passed if the heater was powered or depowered depending on the threshold and the temperature measurement.

If the heater power run mode test is passed, then the method may proceed to operation 310. Otherwise, the method may proceed to operation 312 following operation 308.

At operation 310, the heater is allowed to operate. The heater may be allowed to operate by allowing power to flow to the heater.

When operating the heater may generate heat depending on various conditions such as, for example, whether the temperatures of hardware components are below (e.g., may trigger heat generation) or within operating ranges of the hardware components (e.g., may trigger disablement of heat generation).

The method may end following operation 310.

Returning to operations 304 and 308, the method may proceed to operation 312 following these operations if either of the tests are not passed.

At operation 312, heater operation is disallowed. Heater operation may be disallowed by depriving the heater of power. For example, control signals may be used to modulate operation of a field effect transistor that controls the flow of power to the heater to deprive the heater of power (e.g., placing the field effect transistor into a high impedance state). Additionally, information regarding the conditions that gave rise to disallowing operation of the heater may be logged, signal indicators (e.g., flashing lights) used to attract administrator attention may begin to operation, and/or other actions may be performed to limit the impact of the heater operating outside of that expected under the conditions to which the data processing system is exposed.

Attempts to remediate the heater operation may also be performed. For example, the various hardware components that contribute to management of the heater may be reset (e.g., power cycled, restarted, etc.).

The method may end following operation 312.

Returning to operation 300, as noted above, operation 340 may be performed following operation 300. Turning to FIG. 3C, a continuation of the flowchart shown in FIG. 3A is shown in FIG. 3C.

At operation 340, a timer is set. The timer may be set for a period of time. The period of time may be known to various components that manage operation of the heater. The timer may also begin to run.

At operation 342, a heartbeat signal from at least one firmware enabled component tasked with managing, at least in part, operation of the heater is monitored for while the timer runs. The heartbeat signal may be monitored for by sampling signal lines between the firmware enabled component and the monitoring component (e.g., management controller, thermal manager, etc.). The firmware enabled component may be adapted to send the heartbeat signal periodically or via other modalities within the time limit of the timer. Consequently, if the heartbeat signal is not found during the runtime of the timer, it may be inferred that firmware of the firmware enabled component has failed or is otherwise not operating as expected.

At operation 344, a determination is made regarding whether the heartbeat signal is obtained prior to the expiration of the timer. The determination may be made by comparing if and when a heartbeat signal is identified with respect to expiration of the timer.

If it is determined that the heartbeat signal is obtained prior to the expiration of the timer, then the method may proceed to operation 346. Otherwise, the method may proceed to operation 348.

At operation 346, operation of the heater is allowed. Operation of the heater may be allowed by facilitating flow of power to the heater.

The timer may also be restarted. The timer may be restarted be resetting it to the time that it was originally set for (e.g., in operation 340), and a countdown started.

The method may end following operation 346.

Returning to operation 344, the method may proceed to operation 348 following operation 344 if it is determined that the heartbeat signal was not obtained prior the expiration of the timer.

At operation 348, heater operation is disallowed. Heater operation may be disallowed by depriving the heater of power. For example, control signals may be used to modulate operation of a field effect transistor that controls the flow of power to the heater to deprive the heater of power (e.g., placing the field effect transistor into a high impedance state).

Attempts to remediate the heater operation may also be performed. For example, the various hardware components that contribute to management of the heater may be reset (e.g., power cycled, restarted, etc.).

The method may end following operation 348.

Using the method illustrated in FIGS. 3A and 3C, embodiments disclosed herein may both proactively identify whether firmware and/or hardware components are operating as expected. Consequently, runaway or uncontrolled operation of a heater may be less likely to occur.

Turning to FIG. 3B, a flow diagram illustrating a method of performing a heater power system cutoff test in accordance with an embodiment is shown. The method may be performed, for example, by a data processing system, a thermal manager, a management controller, and/or other components illustrated in FIGS. 1-2.

At operation 320, an ambient temperature is identified. The ambient temperature may be identified by measuring it with a temperature sensor.

At operation 322, a heater power system cutoff is set to a cutoff temperature with respect to the ambient temperature to initiate a heater cutoff. The cutoff temperature may be set, for example, by storing data in a register or other device. By setting the cutoff temperature with respect to the ambient temperature (e.g., below the ambient temperature), then the hardware components that monitor temperature and cutoff power based on the monitoring may be triggered to cut off power to the heater.

At operation 324, an operating state of the heater is monitored following initiation of the heater cutoff. The monitoring may be performed by, for example, monitoring power supplied to the heater, checking a status signal (e.g., the indicates the operating state) from the heater, and/or via other methods.

The method may end following operation 324.

Using the method illustrated in FIG. 3B, a data processing system in accordance with an embodiment may proactively check to validate that hardware components and/or firmware hosted thereby is operating as expected (e.g., even while conditions may otherwise not warrant disallowing flow of power to the heater).

Figure 4:
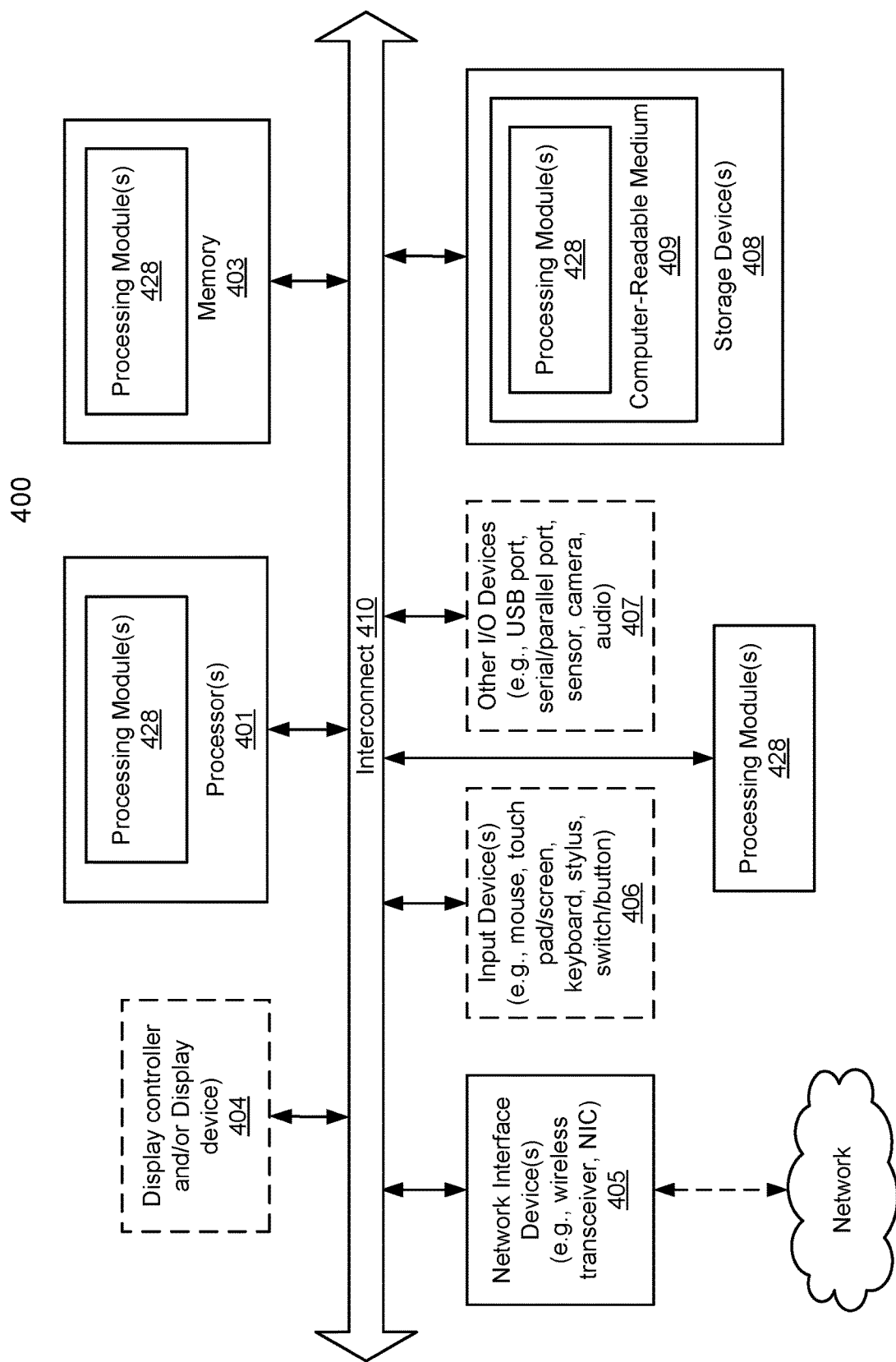
FIG. 4 shows a block diagram illustrating a computing device in accordance with an embodiment.

Any of the components illustrated in FIGS. 1-2 may be implemented with one or more computing devices. Turning to FIG. 4, a block diagram illustrating an example of a computing device in accordance with an embodiment is shown. For example, system 400 may represent any of the data processing systems and/or computing devices described above performing any of the processes or methods described above. System 400 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 400 is intended to show a high level view of many components of the computer system. However, it is to be understood that additional components may be present in certain implementations and furthermore, different arrangement of the components shown may occur in other implementations. System 400 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 400 includes processor 401, memory 403, and devices 405-408 via a bus or an interconnect 410. Processor 401 may represent a single processor or multiple processors with a single processor core or multiple processor cores included therein. Processor 401 may represent one or more general-purpose processors such as a microprocessor, a central processing unit (CPU), or the like. More particularly, processor 401 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 401 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 401, which may be a low power multi-core processor socket such as an ultra-low voltage processor, may act as a main processing unit and central hub for communication with the various components of the system. Such processor can be implemented as a system on chip (SoC). Processor 401 is configured to execute instructions for performing the operations discussed herein. System 400 may further include a graphics interface that communicates with optional graphics subsystem 404, which may include a display controller, a graphics processor, and/or a display device.

Processor 401 may communicate with memory 403, which in one embodiment can be implemented via multiple memory devices to provide for a given amount of system memory. Memory 403 may include one or more volatile storage (or memory) devices such as random access memory (RAM), dynamic RAM (DRAM), synchronous DRAM (SDRAM), static RAM (SRAM), or other types of storage devices. Memory 403 may store information including sequences of instructions that are executed by processor 401, or any other device. For example, executable code and/or data of a variety of operating systems, device drivers, firmware (e.g., input output basic system or BIOS), and/or applications can be loaded in memory 403 and executed by processor 401. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 400 may further include 10 devices such as devices (e.g., 405, 406, 407, 408) including network interface device(s) 405, optional input device(s) 406, and other optional IO device(s) 407. Network interface device(s) 405 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 406 may include a mouse, a touch pad, a touch sensitive screen (which may be integrated with a display device of optional graphics subsystem 404), a pointer device such as a stylus, and/or a keyboard (e.g., physical keyboard or a virtual keyboard displayed as part of a touch sensitive screen). For example, input device(s) 406 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 407 may include an audio device. An audio device may include a speaker and/or a microphone to facilitate voice-enabled functions, such as voice recognition, voice replication, digital recording, and/or telephony functions. Other IO devices 407 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 407 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 410 via a sensor hub (not shown), while other devices such as a keyboard or thermal sensor may be controlled by an embedded controller (not shown), dependent upon the specific configuration or design of system 400.

To provide for persistent storage of information such as data, applications, one or more operating systems and so forth, a mass storage (not shown) may also couple to processor 401. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 401, e.g., via a serial peripheral interface (SPI). This flash device may provide for non-volatile storage of system software, including a basic input/output software (BIOS) as well as other firmware of the system.

Storage device 408 may include computer-readable storage medium 409 (also known as a machine-readable storage medium or a computer-readable medium) on which is stored one or more sets of instructions or software (e.g., processing module, unit, and/or processing module/unit/logic 428) embodying any one or more of the methodologies or functions described herein. Processing module/unit/logic 428 may represent any of the components described above. Processing module/unit/logic 428 may also reside, completely or at least partially, within memory 403 and/or within processor 401 during execution thereof by system 400, memory 403 and processor 401 also constituting machine-accessible storage media. Processing module/unit/logic 428 may further be transmitted or received over a network via network interface device(s) 405.

Computer-readable storage medium 409 may also be used to store some software functionalities described above persistently. While computer-readable storage medium 409 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies disclosed herein. The term "computer-readable storage medium" shall accordingly be taken to include, but not be limited to, solid-state memories, and optical and magnetic media, or any other non-transitory machine-readable medium.

Processing module/unit/logic 428, components and other features described herein can be implemented as discrete hardware components or integrated in the functionality of hardware components such as ASICS, FPGAs, DSPs or similar devices. In addition, processing module/unit/logic 428 can be implemented as firmware or functional circuitry within hardware devices. Further, processing module/unit/logic 428 can be implemented in any combination hardware devices and software components.

Note that while system 400 is illustrated with various components, it is not intended to represent any particular architecture or manner of interconnecting the components; as such details are not germane to embodiments disclosed herein. It will also be appreciated that network computers, handheld computers, mobile phones, servers, and/or other data processing systems which have fewer components or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g., circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein.

In the foregoing specification, embodiments have been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A data processing system that provides computer implemented services, the data processing system comprising:
 a heater positioned to, while powered, selectively warm a temperature sensitive hardware component;
 a temperature sensor positioned to monitor a temperature associated with heating by the heater;
 a heater power system adapted to:
  selectively power the heater based on an adjustable temperature threshold; and
 a thermal manager adapted to:
  identify a startup of the data processing system;
  based on the identified startup:
   perform a cutoff test of the heater power system to identify a power cutoff capability state of the heater power system;
   make, based on the power cutoff capability, a first determination regarding whether the heater power system passed the cutoff test;
   in a first instance of the first determination where the heater power system passed the cutoff test:
    perform a run mode test of the heater power system to obtain a run mode capability state of the heater power system; and
   in a second instance of the first determination where the heater power system did not pass the cutoff test:
    disallow the operation of the heater without performing the run mode test.

2. The data processing system of claim 1, wherein the thermal manager is further adapted to:
 make, based on the run mode capability state, a second determination regarding whether the heater power system passed the run mode test;
 in a first instance of the second determination where the heater power system passed the run mode test:
  allow operation of the heater; and
 in a second instance of the second determination where the heater power system did not pass the run mode test:
  disallow the operation of the heater.

3. The data processing system of claim 2, wherein allowing the operation of the heater comprises:
 setting the adjustable temperature threshold for the operation of the heater to a runtime temperature to obtain an updated adjustable temperature limit.

4. The data processing system of claim 3, wherein selectively powering the heater comprises:
 comparing the temperature monitored by the temperature sensor to the updated adjustable temperature limit; and
 depowering the heater when the temperature exceeds the updated adjustable temperature limit.

5. The data processing system of claim 1, wherein performing the cutoff test of the heater power system comprises:
 identifying an ambient temperature;
 setting a cutoff temperature of the heater power system to a temperature below the ambient temperature; and
 monitoring, while the cutoff temperature is set to the temperature below the ambient temperature, an operating state of the heater to identify the power cutoff capability, the power cutoff capability being positive when the operating state of the heater is inoperable while the cutoff temperature is set to the temperature below the ambient temperature and the power cutoff capability being negative when the operating state of the heater is operable while the cutoff temperature is set to the temperature below.

6. The data processing system of claim 1, wherein the thermal manager is further adapted to:
 based on the identified startup:
  initiate operation of a timer;
  while the timer is operating:
   monitor for a heartbeat signal from at least one firmware enabled component tasked with managing, in part, operation of the heater;
   make, based on the monitoring for the heartbeat signal, a second determination regarding whether the heartbeat signal is obtained prior to expiration of the timer;
   in a first instance of the second determination where the heartbeat signal is not obtained prior to the expiration of the timer:
    disallow operation of the heater; and
   in a second instance of the second determination where the heartbeat signal is obtained prior to the expiration of the timer:
    allow operation of the heater, and
    restart the time.

7. The data processing system of claim 1, wherein the heater is depowered until selectively powered by the heater power system after the startup begins.

8. The data processing system of claim 1, wherein the temperature sensitive hardware component comprises a management controller that manages operation of the data processing system.

9. The data processing system of claim 1, wherein the heater comprises a resistive heating element.

10. A computer-implemented method for providing computer implemented services with a data processing system, the method comprising:
 identifying a startup of the data processing system;
 based on the identified startup:
  performing a cutoff test of a heater power system to identify a power cutoff capability state of the heater power system, the heater power system being adapted to selectively power a heater based on an adjustable temperature threshold, and the heater being positioned to, while powered, selectively warm a temperature sensitive hardware component of the data processing system;
  making, based on the power cutoff capability and a temperature associated with heating by the heater and monitored by a temperature sensor, a first determination regarding whether the heater power system passed the cutoff test;
  in a first instance of the first determination where the heater power system passed the cutoff test:
   performing a run mode test of the heater power system to obtain a run mode capability state of the heater power system; and
  in a second instance of the first determination where the heater power system did not pass the cutoff test:
   disallow the operation of the heater without performing the run mode test.

11. The computer-implemented method of claim 10, further comprising:
 making, based on the run mode capability state, a second determination regarding whether the heater power system passed the run mode test;

in a first instance of the second determination where the
heater power system passed the run mode test:
allowing operation of the heater; and
in a second instance of the second determination where
the heater power system did not pass the run mode test:
disallowing the operation of the heater.

12. The computer-implemented method of claim 10, wherein performing the cutoff test of the heater power system comprises:
identifying an ambient temperature;
setting a cutoff temperature of the heater power system to a temperature below the ambient temperature; and
monitoring, while the cutoff temperature is set to the temperature below the ambient temperature, an operating state of the heater to identify the power cutoff capability, the power cutoff capability being positive when the operating state of the heater is inoperable while the cutoff temperature is set to the temperature below the ambient temperature and the power cutoff capability being negative when the operating state of the heater is operable while the cutoff temperature is set to the temperature below.

13. The computer-implemented method of claim 10, further comprising:
based on the identified startup:
initiating operation of a timer;
while the timer is operating:
monitoring for a heartbeat signal from at least one firmware enabled component tasked with managing, in part, operation of the heater;
making, based on the monitoring for the heartbeat signal, a second determination regarding whether the heartbeat signal is obtained prior to expiration of the timer;
in a first instance of the second determination where the heartbeat signal is not obtained prior to the expiration of the timer:
disallowing operation of the heater; and
in a second instance of the second determination where the heartbeat signal is obtained prior to the expiration of the timer:
allowing operation of the heater, and
restarting the time.

14. The computer-implemented method of claim 10, wherein the heater is depowered until selectively powered by the heater power system after the startup begins.

15. The computer-implemented method of claim 10, wherein the temperature sensitive hardware component comprises a management controller that manages operation of the data processing system.

16. The computer-implemented method of claim 10, wherein the heater comprises a resistive heating element.

17. A non-transitory machine-readable medium having instructions stored therein, which when executed by a processor, cause a data processing system to perform operations for providing computer implemented services with a data processing system, the operations comprising:
identifying a startup of the data processing system;
based on the identified startup:
performing a cutoff test of a heater power system to identify a power cutoff capability state of the heater power system, the heater power system being adapted to selectively power a heater based on an adjustable temperature threshold, and the heater being positioned to, while powered, selectively warm a temperature sensitive hardware component of the data processing system;
making, based on the power cutoff capability and a temperature associated with heating by the heater and monitored by a temperature sensor, a first determination regarding whether the heater power system passed the cutoff test;
in a first instance of the first determination where the heater power system passed the cutoff test:
performing a run mode test of the heater power system to obtain a run mode capability state of the heater power system; and
in a second instance of the first determination where the heater power system did not pass the cutoff test:
disallow the operation of the heater without performing the run mode test.

18. The non-transitory machine-readable medium of claim 17, wherein the operations further comprise:
making, based on the run mode capability state, a second determination regarding whether the heater power system passed the run mode test;
in a first instance of the second determination where the heater power system passed the run mode test:
allowing operation of the heater; and
in a second instance of the second determination where the heater power system did not pass the run mode test:
disallowing the operation of the heater.

19. The non-transitory machine-readable medium of claim 17, wherein performing the cutoff test of the heater power system comprises:
identifying an ambient temperature;
setting a cutoff temperature of the heater power system to a temperature below the ambient temperature; and
monitoring, while the cutoff temperature is set to the temperature below the ambient temperature, an operating state of the heater to identify the power cutoff capability, the power cutoff capability being positive when the operating state of the heater is inoperable while the cutoff temperature is set to the temperature below the ambient temperature and the power cutoff capability being negative when the operating state of the heater is operable while the cutoff temperature is set to the temperature below.

20. The non-transitory machine-readable medium of claim 17, wherein the operations further comprise:
based on the identified startup:
initiating operation of a timer;
while the timer is operating:
monitoring for a heartbeat signal from at least one firmware enabled component tasked with managing, in part, operation of the heater;
making, based on the monitoring for the heartbeat signal, a second determination regarding whether the heartbeat signal is obtained prior to expiration of the timer;
in a first instance of the second determination where the heartbeat signal is not obtained prior to the expiration of the timer:
disallowing operation of the heater; and
in a second instance of the second determination where the heartbeat signal is obtained prior to the expiration of the timer:
allowing operation of the heater, and
restarting the time.

\* \* \* \* \*